United States Patent [19]

Barnett

[11] Patent Number: 5,004,426

[45] Date of Patent: Apr. 2, 1991

[54] ELECTRICALLY CONNECTING

[75] Inventor: Roy Barnett, Nashua, N.H.

[73] Assignee: Teradyne, Inc., Boston, Mass.

[21] Appl. No.: 409,145

[22] Filed: Sep. 19, 1989

[51] Int. Cl.[5] .................. H05K 1/00

[52] U.S. Cl. .................. 439/82; 439/856

[58] Field of Search .................. 439/851-858, 439/741, 751, 55, 78-83, 65, 44, 45, 46, 49, 876, 62

[56] References Cited

U.S. PATENT DOCUMENTS

| | | | |
|---|---|---|---|
| 3,085,139 | 4/1963 | Wright | 439/83 |
| 3,368,188 | 2/1968 | Olsson | 439/876 |
| 3,506,879 | 4/1970 | Maxwell et al. | 439/83 |
| 3,706,065 | 12/1972 | Knitter et al. | 439/83 |
| 3,910,671 | 10/1975 | Townsend | 439/751 |
| 4,651,416 | 3/1987 | De Paul | 439/78 |
| 4,686,607 | 8/1987 | Johnson | 439/65 |
| 4,776,804 | 10/1988 | Johnson et al. | 439/79 |

*Primary Examiner*—David L. Pirlot

[57] ABSTRACT

A contact assembly in which holes of a contact pin support member carry a plurality of contact pins.

5 Claims, 1 Drawing Sheet

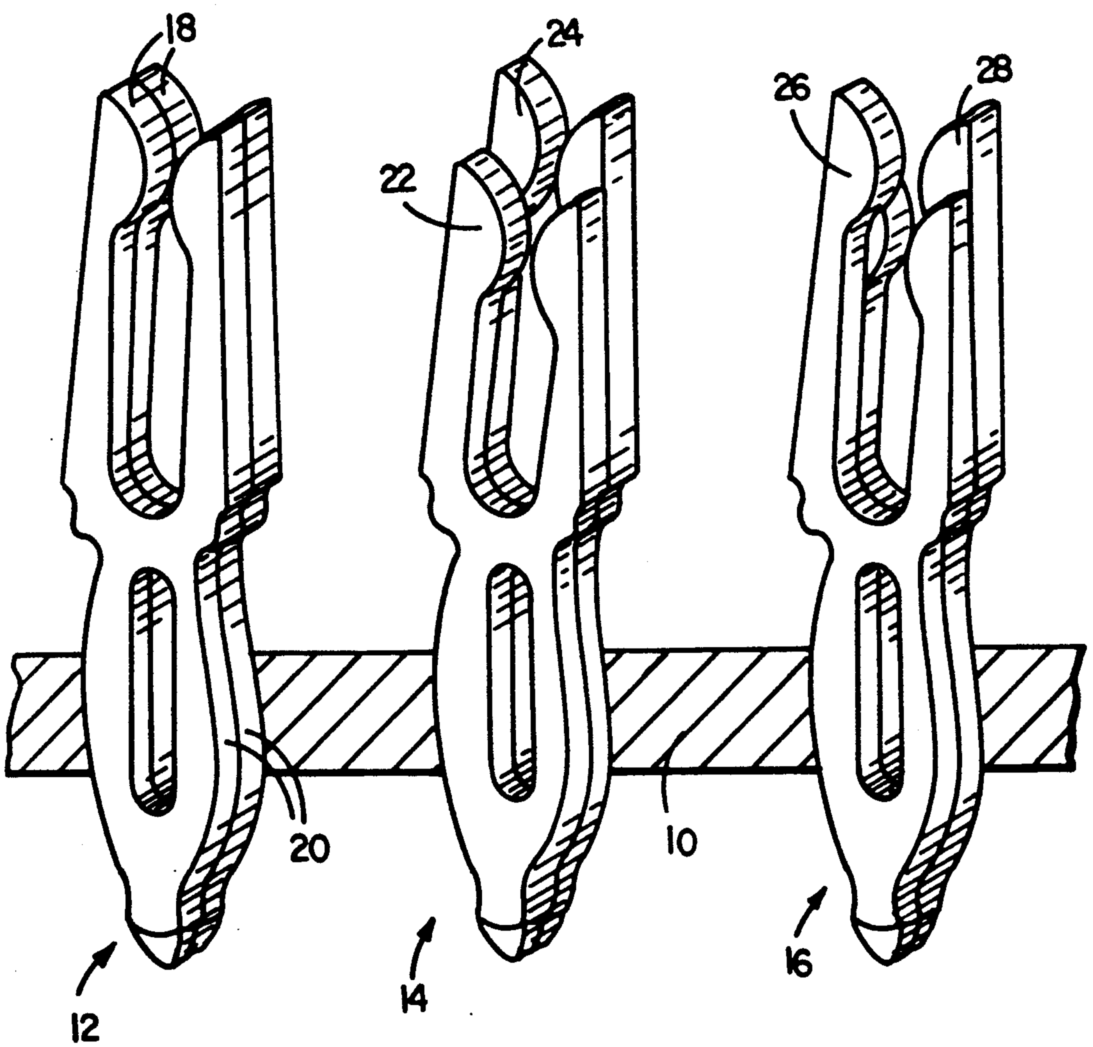
FIGURE

ELECTRICALLY CONNECTING

FIELD OF THE INVENTION

This invention relates to electrically contacting, particularly to printed circuit boards.

BACKGROUND OF THE INVENTION

It is known to use a pin press-fitted into a soldered hole in a printed circuit board ("PCB") to electrically connect with the PCB, as in Johnson U.S. Pat. No. 29,513, "Electrical Connection Apparatus", granted Jan. 10, 1978. It is known also to use a tuning-fork type female portion on the pin's end, to engage a blade portion of a connecting member, as in Johnson et al. U.S. Pat. No. 4,655,518, "Backplane Connector", granted Apr. 7, 1987. It is known to longitudinally stagger tuning for contact portions so that not all encounter male pins simultaneously, to reduce insertion forces.

SUMMARY OF THE INVENTION

I have discovered that reliability may be increased by providing in one or more holes of the pin-supporting member a plurality of pins. In preferred embodiments, the pins terminate in longitudinally spaced tuning fork portions.

PREFERRED EMBODIMENT

A presently preferred embodiment is shown in the drawing, and is now described.

DRAWING

The figure is an isometric view, partially in section, and somewhat diagrammatic, of a PCB carrying three different sets of pins according to the invention.

STRUCTURE

There is shown in the figure a PCB 10 carrying three pairs of contacts indicated generally at 12, 14, 16. The pair 12 has two contacts 18 each extending longitudinally the same distance above PCB 10, in cylindrical holes (unlike the diagrammatic drawing) of which, internally solder-coated, are press-fitted portions 20. Sets 14 and 16 are related to PCB 10 in just the same way, both mechanically and electrically. However, the tines of the tuning fork portion 22 are longitudinally closer to PCB 10 than are the tines of the tuning fork portion 24. In the tuning fork portion 26, one tine is longitudinally further from PCB 10 than the other; and in tuning fork portion 28 the same is true, but in reverse relationship.

OPERATION

As illustrated in the figure, various sets of pins may be used in, for example, PCB plated-through holes of the same size. Some such holes could be occupied by single pins of twice the thickness of each pin of the pairs 12, 14, 16, or by more than two pins of less thickness than those pairs.

Use of a plurality of pins per hole permits redundancy of contact. Thus, with a single tuning fork contact per hole, there are two contact paths, one through each side of the tuning fork. With a pair of tuning fork contacts each of half the thickness of the single fork just mentioned, there are four paths. And by varying longitudinal length, as in contacts 14 and 16, insertion force can be decreased by twenty per cent.

Use in each hole of a plurality of contacts as described permits not only varying what is done at various holes, but retrofitting old devices to do the same.

Use in each hole of a plurality of contacts increases the number of effective springs per hole, increasing reliability: with one contact there are in effect two springs per hole, with two contacts four springs, and so on.

Greater design flexibility, with more choice for compromise between normal forces and insertion forces is provided. Only slight, straightforward changes from prior art manufacturing procedures are required.

OTHER EMBODIMENTS

Other embodiments will occur to those skilled in the art.

For example, a preferred embodiment would have each hole in the contact carrier carrying two identical contacts, for example the pair shown in the drawings at 14.

What is claimed is:

1. An electrical connector comprising
- a contact support with a plurality of holes therethrough and
- a plurality of contacts extending through at least one of said holes,
- each said contact being a forked contact having opposing, integral tines and a space for receiving a mating contact between said tines,
- contacts sharing the same hole having their tines and spaces extending in the same direction from said support and being adjacent to each other.

2. The connector of claim 1 in which said holes are plated through.

3. The connector of claim 1 in which said plurality of contacts is two.

4. The connector of claim 1 in which tines of said contacts are of different longitudinal length.

5. The connector of claims 2, 3, or 4 in which the tines of each said forked contact are of the same longitudinal length.

* * * * *